United States Patent [19]

Jo

[11] Patent Number: 5,666,066
[45] Date of Patent: Sep. 9, 1997

[54] OVERCURRENT DETECTING DEVICE FOR A DC MOTOR

[75] Inventor: Hyun-min Jo, Seoul, Rep. of Korea

[73] Assignee: Samsung Electronics Co., Ltd., Suwon, Rep. of Korea

[21] Appl. No.: 564,726

[22] Filed: Nov. 29, 1995

[30] Foreign Application Priority Data

Nov. 29, 1994 [KR] Rep. of Korea ............ 94-31744

[51] Int. Cl.$^6$ ............................................. H02P 5/40
[52] U.S. Cl. ................................................. 324/772
[58] Field of Search .......................... 324/772, 545, 324/158.1; 361/63, 65, 78, 87, 88, 90, 94, 23, 31, 30; 318/490, 690, 810, 472; 340/648

[56] References Cited

U.S. PATENT DOCUMENTS

| | | | |
|---|---|---|---|
| 4,432,031 | 2/1984 | Premerlani | 361/94 |
| 4,445,080 | 4/1984 | Curtiss | 324/772 |
| 4,451,897 | 5/1984 | Sawada et al. | 324/772 |
| 4,525,763 | 6/1985 | Hardy et al. | 318/472 |
| 4,670,698 | 6/1987 | Fulton et al. | 324/772 |

*Primary Examiner*—Vinh P. Nguyen
*Attorney, Agent, or Firm*—Cushman Darby & Cushman, IP Group of Pillsbury Madison & Sutro LLP

[57] ABSTRACT

An overcurrent-detecting device for a DC motor includes a converter for changing a current signal to a voltage signal in a motor; an integrator for comparing an input signal from the convertor with a first reference voltage, and for integrating an excessive value of the reference voltage; and a detector for comparing an input signal from the integrator with a second reference voltage, sensing an overcurrent when the input signal is smaller than the second reference voltage, and outputting a resultant signal. In detecting an overcurrent of the DC motor, the device integrates a higher voltage than a reference voltage, and then detects an overcurrent when the DC motor is constrained. This overcurrent-detecting device, therefore, can be exactly operated by a small-capacity capacitor without incorrect operation with respect to noise and abrupt overload, while not permitting forced operation in the initial operation, and also can be operated quickly in response to an actual mechanical constraint having a reasonable overcurrent.

4 Claims, 3 Drawing Sheets

OVERCURRENT DETECTING DEVICE FOR A DC MOTOR

BACKGROUND OF THE INVENTION

The present invention relates in general to an overcurrent-detecting device for a DC motor, and more particularly, to a device which changes a current signal of a DC motor to a voltage signal, integrates a higher voltage than a reference voltage, and then detects an overcurrent when the DC motor is constrained. This overcurrent-detecting device, therefore, can be precisely operated by a small-capacity capacitor, without incorrect operation with respect to noise and abrupt overload, while not permitting forced operation in the initial operation, and also can be operated quickly in response to an actual mechanical constraint having a reasonable overcurrent.

DESCRIPTION OF THE PRIOR ART

A typical prior art motor forms a current waveform as shown in FIG. 3. In section A of this figure, current rises having a sharp slope of the rising portion of the waveform if the motor begins to operate at the point of t(0), and returns to an operating current portion of the steady-state, when the motor is in operation. Then, in section B, where the motor is constrained, the motor stops operating, though power is still supplied. This phenomenon may damage the motor.

When the DC motor described above is operated by a mechanical relay system or semiconductor power elements, it is occasionally necessary to stop the power supply to protect the motor from damage due to mechanical constraint.

Under such constraint, generally, a method has been used that either the relay or the semiconductor element is caused to be turned off, after detecting the overcurrent of the DC motor.

It is desirable that the overcurrent protection device is operated with a delay time when overcurrent is generated by initial operation or an abrupt overload in signal circuits. Accordingly, the typical prior art device detects overcurrent with a delay time, from the initial operation to the steady operation, i.e., about 0.2 to 0.4 sec., to prevent incorrect operation resulting from the overcurrent in the initial operation.

However, a thus-constructed circuit has a complicated circuit configuration. Besides, even when the motor is constrained during the overcurrent, the circuit is still operated by force, thus leading to damage of the device.

Further, in another prior art, motor control system a low-pass filter (LPF) has been used. However, this also has disadvantages in that a large capacitor is required, and the circuit is incorrectly operated with ease under an operating current somewhat exceeding the reference current, having low frequency, when the mechanical device is operated with little oil or at low temperature. In addition, when the actual constraint is generated, the response time thereto is very slow.

SUMMARY OF THE INVENTION

It is an object of this invention to solve the above-mentioned problems of the prior art.

Another object is to provide an overcurrent-detecting device of a DC motor, having no incorrect operation resulting from noise or an abrupt overload, and no forced initial operation even when the device is constrained, while still permitting rapid response in real constraint.

To achieve these objects, according to a preferred embodiment of the present invention, an overcurrent-detecting device is comprised of a converter for changing a current signal to a voltage signal in a motor; an integrator for comparing an input signal of the integrator from the convertor with a first reference voltage, and integrating the excess value of the reference voltage; a detector for comparing an input signal to the detector from the integrator with a second reference voltage, sensing an overcurrent when the second reference voltage is smaller than the input signal, and outputting a resultant signal.

DETAILED DESCRIPTION OF THE PREFERRED EMBODIMENTS

A preferred embodiment of the present invention is described below with reference to the accompanying drawings.

Figure 2A:
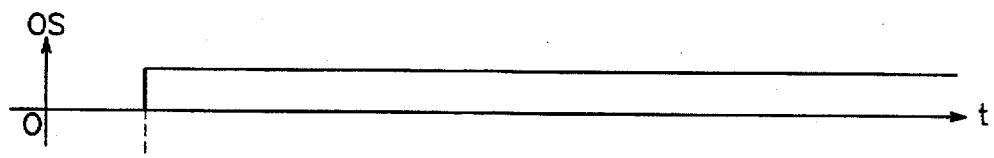
FIGS. 2A to 2D are waveforms obtained from use of the device of FIG. 1.
Figure 2B:
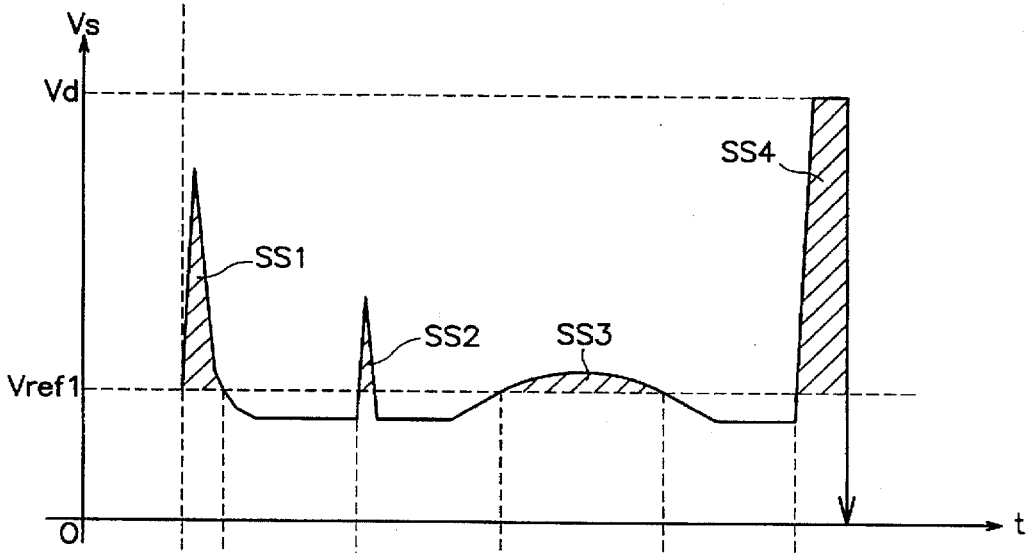
Figure 2C:
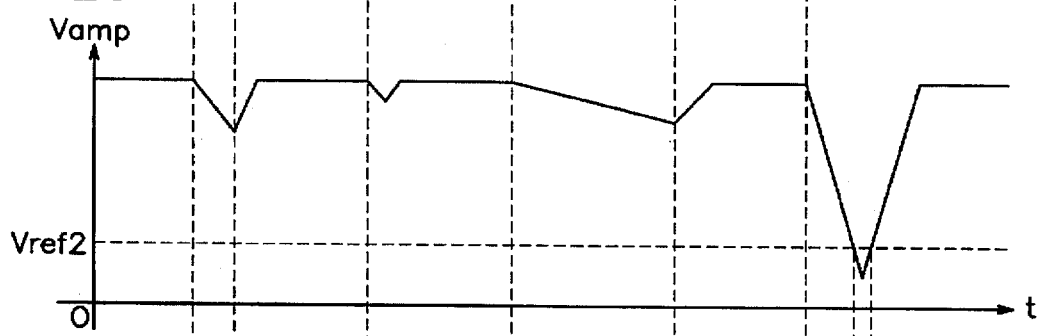
Figure 2D:
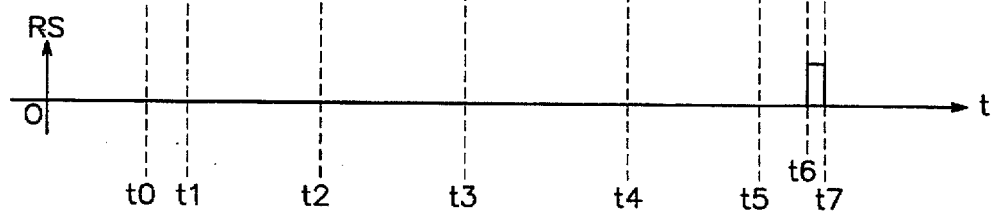
Figure 3:
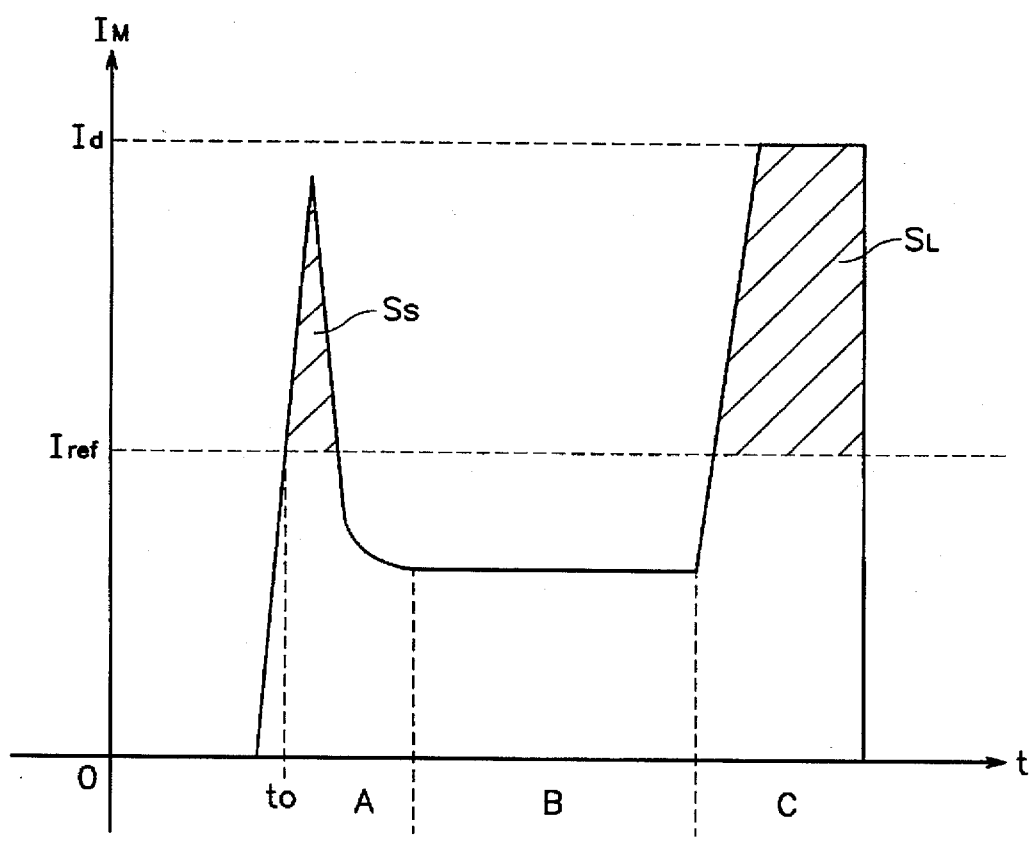
FIG. 3 is a waveform diagram of a typical prior art overcurrent-detecting device of a motor.

Here, FIG. 2A shows an input waveform when a motor starts driving, FIG. 2B shows waveforms of the voltage of the motor and a first reference voltage as a function of time, FIG. 2C shows waveforms of an integrated voltage and a second reference voltage as a function of time, and FIG. 2D shows a reset signal as a function of time.

Figure 1:
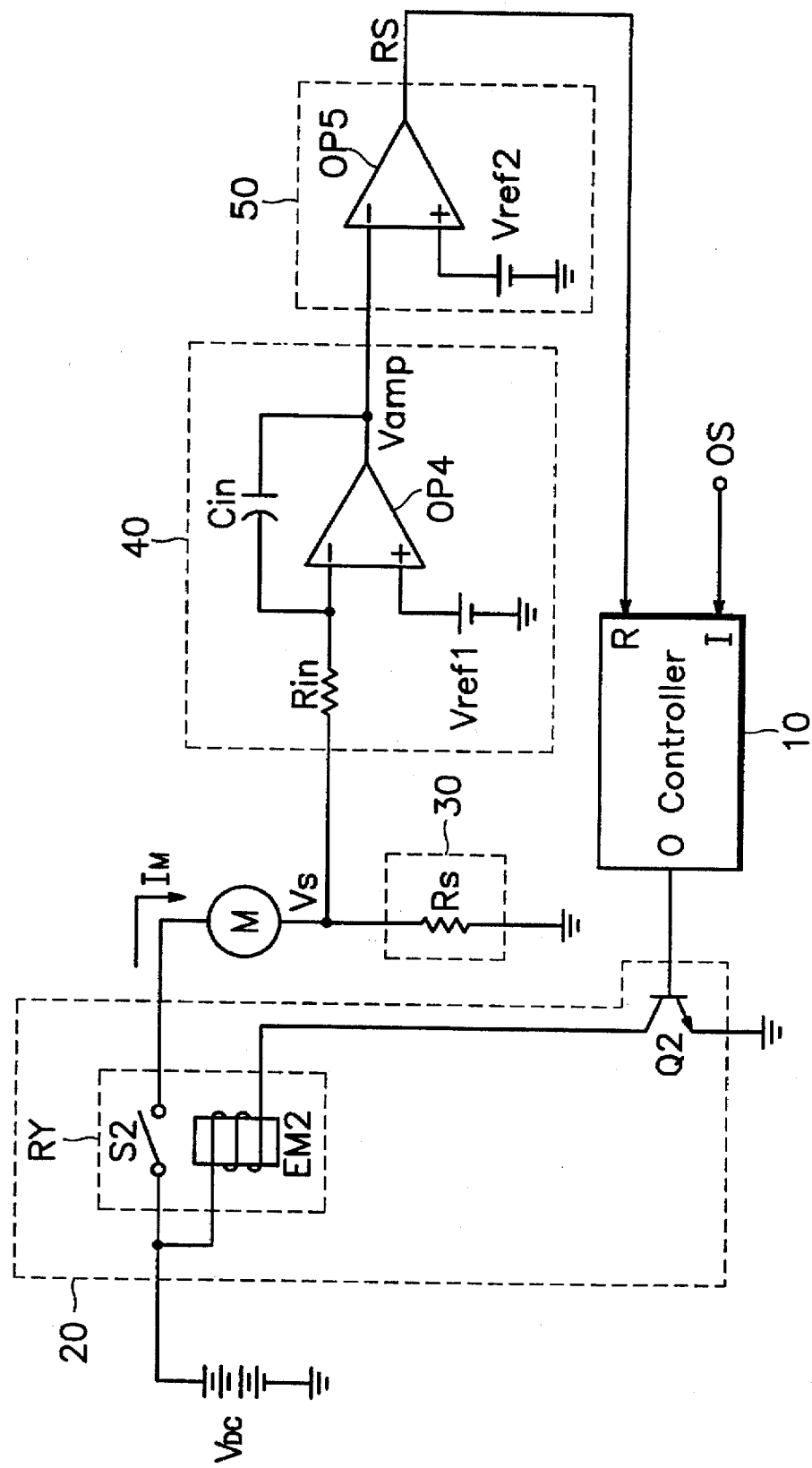
FIG. 1 is a circuit diagram illustrating an overcurrent-detecting device of a preferred embodiment of the present invention.

As shown in FIG. 1, an overcurrent-detecting device of a motor is comprised of a controller 10 for receiving a motor-driving signal from the exterior, through an input terminal I, and a reset signal through a reset terminal R, and outputting a motor control signal through an output terminal 0; a motor-driving circuit 20 for outputting an actual motor driving signal to the control signal from the controller 10; a converter 30 for changing a current value of the motor to voltage; an integrator 40 for comparing an input signal to the integrator from the converter 30, with a first reference voltage, and for integrating the excessive voltage of the reference voltage; and a detector 50 for comparing an input signal to the detector from the integrator 40, with a second reference voltage, for sensing an overcurrent when the input signal is smaller than the second reference voltage, and outputting a reset signal to be returned to the controller 10.

The above-described motor-driving circuit 20 is comprised of a transistor Q2, of which the base terminal is connected to an output terminal 0 of the controller 10, while emitter terminal is connected to ground; and a relay RY, of which one terminal is connected to a power source $V_{DC}$, and an input terminal is connected to a collector terminal of the transistor Q2.

The relay RY includes an electromagnet EM2, of which one terminal is connected to the power source $V_{DC}$ and another terminal is connected to the collector terminal of the transistor Q2, and a switch S2, of which one terminal is connected to the terminal of the eletromanet EM2 and another terminal is connected to one terminal of the motor M.

The converter 30 has a resistance Rs, of which one terminal is connected to another terminal of the motor M and another terminal is connected to ground.

The integrator 40 includes an input resistance Rin, of which the one terminal is connected to the terminal of the resistance Rs, an operational amplifier OP4, of which the inverse input terminal is connected to the terminal of the resistance Rin and the noninverse terminal is connected to the first reference voltage Vref1, and a capacitor Cin, of which one terminal is connected to the terminal of the input resistance Rin and another terminal is connected to an output terminal of the operational amplifier OP4.

The detector 50 includes an operational amplifier OP5, of which the inverse terminal is connected to an output terminal of the integrator 40 and the noninverse terminal is connected to a second reference voltage vref2.

Provided that an operating signal OS of FIG. 2A is fed to the input terminal I of the controller 10, the controller 10 outputs the control signal to the motor driving circuit 20, so that the transistor Q2 is turned on and the switch S2 of the relay RY is turned off. Subsequently, on receiving the power source $V_{DC}$, the motor M begins driving.

At this time, the motor M has the voltage Vs as shown in FIG. 2B, with the motor current $I_M$ and the resistance Rs of the converter 30.

The integrator 40 receives the motor voltage Vs, passing through the input resistance Rin, with the inverse input terminal.

The input resistance Rin is considerably larger than the resistance Rs of the converter 30, and thus there is no influence on the signal value of the resistance Rs.

Next, the input motor voltage Vs is compared with the first reference voltage Vref1, followed by integrating the excess voltage of the voltage Vref1, then outputting the integrated voltage Vamp of FIG. 2C.

Subsequently, the comparator 50 receives the integrated voltage Vamp through the noninverse input terminal, and compares the input voltage Vamp with the second reference voltage Vref2, and then outputs the reset signal RS of FIG. 2D to the controller 10, when the voltage Vamp is less than the second reference voltage Vref2.

Then, the controller 10 receives the reset signal RS through the reset terminal R, and outputs a turn-off signal for the motor M.

In this procedure, as shown in FIG. 2B, an abrupt overcurrent SS1 may occur when the motor M begins driving in response to the starting signal OS, and at this time, the motor voltage Vs is lager than the first reference voltage Vref1. Nevertheless, the motor should be operated without interruption.

Accordingly, the voltage Vamp of FIG. 2C, resulting from integrating the excessive voltage of the reference voltage of the motor voltage Vs, is compared with the second reference voltage vref2. As a result of such comparison, no reset signal RS for ceasing the driving is outputted, because the overcurrent value is not enough to cause damage to the motor M.

Meanwhile, an abrupt restriction may occur in the motor in operation, generating an abrupt overcurrent SS2. Even when the motor voltage Vs is lager than the first reference voltage Vref1, however, the motor should be operated without interruption.

Accordingly, this circuit outputs no reset signal RS, since the second reference voltage Vref2 is lager than the integrated voltage Vamp, when comparing two voltages Vamp and Vref2.

Further, the long-lasting overcurrent SS3 of FIG. 2B, though being a small amount, may occur due to an increase of frictional force between the mechanical device and the motor M. Under this circumstance, however, there is also no necessity for ceasing the driving of the motor M, because such overcurrent is not enough to destroy the motor.

Accordingly, this circuit outputs no reset signal RS, since the second reference voltage Vref2 is larger than the integrated voltage Vamp.

However, in case the overcurrent SS4 of FIG. 2B occurs which is generated when the operation of the motor M associated with the mechanical device is finished or the motor is constrained, the motor voltage Vs is larger than the first reference voltage Vref1 and the integrated voltage Vamp is larger than the second reference voltage Vref2. The reset signal is then outputted in response to the signal from the controller 10.

In other words, it is possible to process the abrupt overcurrent SS1 at the initial operation, the abrupt overcurrent SS2 in operation, and the insignificant overcurrent SS3 due to an increase of mechanical frictional force, distinctly from the overcurrent SS4 resulting from actual constraint of the motor M.

In conclusion, the effects of this invention can be summarized that, the abrupt overcurrent SS1 at the initial operation, the abrupt overcurrent SS2 in operation, and the minute overcurrent SS3 due to an increase of mechanical frictional force, can be accurately distinguished from the overcurrent SS4 resulting from actual constraint of the motor, by integrating the overcurrent of the motor, comparing the integrated voltage with a reference voltage, and then detecting the overcurrent when the DC motor is constrained. Thus, the motor can be precisely operated by a small-capacity capacitor, without incorrect operation with respect to noise and abrupt overload, even when the mechanical device is constrained, and also operated quickly in response to an actual constraint having a reasonable overcurrent.

What is claimed is:

1. An overcurrent-detecting device for a motor comprising;

a converter for changing a current signal in a motor to a voltage signal;

an integrator for comparing an input signal to said integrator from the converter, with a first reference voltage, and integrating a portion of said input signal exceeding said first reference voltage; and a detector for comparing an input signal to said detector from the integrator, with a second reference voltage, sensing an overcurrent when the input signal to said detector is smaller than the second reference voltage, and outputting a resultant signal as an overcurrent-detection signal.

2. An overcurrent-detecting device of claim 1, in which:

the converter has a resistance, of which one terminal is arranged to be connected to a terminal of the motor, and another terminal is connected to ground.

3. An overcurrent-detecting device of claim 2, in which:

the integrator includes an input resistance, of which one terminal is connected to a terminal of said resistance, an operational amplifier, of which an inverse input terminal is connected to a terminal of said resistance and of which a noninverse terminal is connected to the first reference voltage, and a capacitor, of which one terminal is connected to a terminal of said input resistance, and of which another terminal is connected to an output terminal of the operational amplifier.

4. An overcurrent-detecting device of claim 3, in which:

said input resistance of the integrator is considerably larger than said resistance of said converter, and thereby has no effect on said resistance of said converter.

* * * * *